(12) United States Patent
Sasaki et al.

(10) Patent No.: US 11,638,349 B2
(45) Date of Patent: Apr. 25, 2023

(54) METAL-CLAD LAMINATE AND PRINTED WIRING BOARD

(71) Applicant: Panasonic Intellectual Property Management Co., Ltd., Osaka (JP)

(72) Inventors: Dai Sasaki, Fukushima (JP); Yasunori Nishiguchi, Osaka (JP); Kazuki Matsumura, Fukushima (JP); Yohsuke Ishikawa, Fukushima (JP); Hiroki Tamiya, Fukushima (JP); Koji Kishino, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/621,011

(22) PCT Filed: Jun. 19, 2020

(86) PCT No.: PCT/JP2020/024182
§ 371 (c)(1),
(2) Date: Dec. 20, 2021

(87) PCT Pub. No.: WO2020/262245
PCT Pub. Date: Dec. 30, 2020

(65) Prior Publication Data
US 2022/0353988 A1    Nov. 3, 2022

(30) Foreign Application Priority Data
Jun. 26, 2019  (JP) .............................. JP2019-119108

(51) Int. Cl.
*H05K 1/03* (2006.01)
*H05K 1/05* (2006.01)

(52) U.S. Cl.
CPC ........... *H05K 1/036* (2013.01); *H05K 1/0366* (2013.01); *H05K 1/0373* (2013.01); *H05K 1/05* (2013.01);
(Continued)

(58) Field of Classification Search
CPC ... H05K 2201/0221; H05K 2201/0224; H05K 2201/0227; H05K 1/0373; H05K 1/036
See application file for complete search history.

(56) References Cited

U.S. PATENT DOCUMENTS

| | | | |
|---|---|---|---|
| 2007/0085126 A1* | 4/2007 | Hsu | H05K 1/0373 |
| | | | 257/306 |
| 2014/0116764 A1 | 5/2014 | Inoue et al. | |
| 2017/0223843 A1 | 8/2017 | Kawakami et al. | |

FOREIGN PATENT DOCUMENTS

| | | |
|---|---|---|
| JP | 2013-000995 | 1/2013 |
| JP | 2014-150133 | 8/2014 |

(Continued)

OTHER PUBLICATIONS

Official Communication issued in International Patent Application No. PCT/JP2020/024182, dated Aug. 25, 2020, along with an English translation thereof.

*Primary Examiner* — Jeremy C Norris
(74) *Attorney, Agent, or Firm* — Greenblum & Bernstein, P.L.C.

(57) ABSTRACT

A metal-clad laminate includes: an insulating layer; and a metal layer stacked on the insulating layer. The insulating layer includes: a first layer; and a second layer interposed between the first layer and the metal layer. The first layer contains a cured product of a first resin composition containing composite particles. The second layer contains a cured product of a second resin composition. The first resin composition contains composite particles, each having a core containing a fluororesin and a shell containing a silicon (Continued)

oxide that coats the core at least partially. The second resin composition may or may not contain composite particles. When the second resin composition contains the composite particles, a ratio of the composite particles in the second resin composition to solid content of the second resin composition is lower than a ratio of the composite particles in the first resin composition to solid content of the first resin composition.

19 Claims, 2 Drawing Sheets

(52) U.S. Cl.
CPC ............... *H05K 2201/0218* (2013.01); *H05K 2201/0227* (2013.01); *H05K 2201/0266* (2013.01)

(56) References Cited

FOREIGN PATENT DOCUMENTS

| | | |
|---|---|---|
| JP | 2015-159177 | 9/2015 |
| JP | 2017-073531 | 4/2017 |
| JP | 2019-001965 | 1/2019 |
| WO | 2015/133513 | 9/2015 |

* cited by examiner

METAL-CLAD LAMINATE AND PRINTED WIRING BOARD

CROSS-REFERENCE TO RELATED APPLICATIONS

This application is a National Stage of International Application No. PCT/JP2020/024182 filed Jun. 19, 2020, claiming priority to Japanese Patent Application No. 2019-119108 filed Jun. 26, 2019, the contents of both applications are incorporated herein by reference in their entirety.

TECHNICAL FIELD

The present disclosure relates to a metal-clad laminate and a printed wiring board.

BACKGROUND ART

Patent Literature 1 teaches that the relative dielectric constant of an insulating layer of a metal-clad laminate may be lowered by forming the insulating layer of a resin composition including a modified polyphenylene ether having, at one terminal, a substituent with a carbon-carbon double bond, a cross-linking agent with a carbon-carbon double bond, and particles containing a fluororesin.

CITATION LIST

Patent Literature

Patent Literature 1: JP 2019-1965 A

SUMMARY OF INVENTION

The present inventors discovered that according to the technique disclosed in Patent Literature 1, the relative dielectric constant of the insulating layer certainly tended to be lowered by the particles containing the fluororesin but the peel strength of a metal layer, stacked on the insulating layer of the metal-clad laminate, with respect to the insulating layer tended to decrease.

The problem to be overcome by the present disclosure is to provide a metal-clad laminate and a printed wiring board, both of which facilitate lowering the relative dielectric constant of an insulating layer and reduce the chances of causing a decrease in the peel strength of a metal layer with respect to the insulating layer.

A metal-clad laminate according to an exemplary embodiment includes: an insulating layer; and a metal layer stacked on the insulating layer. The insulating layer includes: a first layer; and a second layer interposed between the first layer and the metal layer. The first layer contains a cured product of a first resin composition. The second layer contains a cured product of a second resin composition. The first resin composition contains composite particles. Each of the composite particles has a core containing a fluororesin and a shell containing a silicon oxide that coats the core at least partially. The second resin composition either contains composite particles, each of which has a core containing the fluororesin and a shell containing the silicon oxide that coats the core at least partially, or contains no such composite particles. When the second resin composition contains the composite particles, a ratio of the composite particles in the second resin composition to solid content of the second resin composition is lower than a ratio of the composite particles in the first resin composition to solid content of the first resin composition.

A printed wiring board according to another exemplary embodiment includes: an insulating layer; and conductor wiring stacked on the insulating layer. The insulating layer includes: a first layer; and a second layer interposed between the first layer and the conductor wiring. The first layer contains a cured product of a first resin composition. The second layer contains a cured product of a second resin composition. The first resin composition contains composite particles, each of which has a core containing a fluororesin and a shell containing a silicon oxide that coats the core at least partially. The second resin composition either contains composite particles, each of which has a core containing the fluororesin and a shell containing the silicon oxide that coats the core at least partially, or contains no such composite particles. When the second resin composition contains the composite particles, a ratio of the composite particles in the second resin composition to solid content of the second resin composition is lower than a ratio of the composite particles in the first resin composition to solid content of the first resin composition.

DESCRIPTION OF EMBODIMENTS

JP 2019-1965 A teaches that the relative dielectric constant of an insulating layer of a metal-clad laminate may be lowered by forming the insulating layer of a resin composition including a modified polyphenylene ether having, at one terminal, a substituent with a carbon-carbon double bond, a cross-linking agent with a carbon-carbon double bond, and particles containing a fluororesin.

The present inventors carried out extensive research and development on metal-clad laminates. As a result, the present inventors discovered that according to the technique disclosed in JP 2019-1965 A, the relative dielectric constant of the insulating layer certainly tended to be lowered by the particles containing the fluororesin but the peel strength of a metal layer, stacked on the insulating layer of the metal-clad laminate, with respect to the insulating layer tended to decrease.

The problem to be overcome by the present disclosure is to provide a metal-clad laminate and a printed wiring board, both of which facilitate lowering the relative dielectric constant of an insulating layer and reduce the chances of causing a decrease in the peel strength of a metal layer with respect to the insulating layer.

Next, an exemplary embodiment of the present disclosure will be described.

Figure 1:
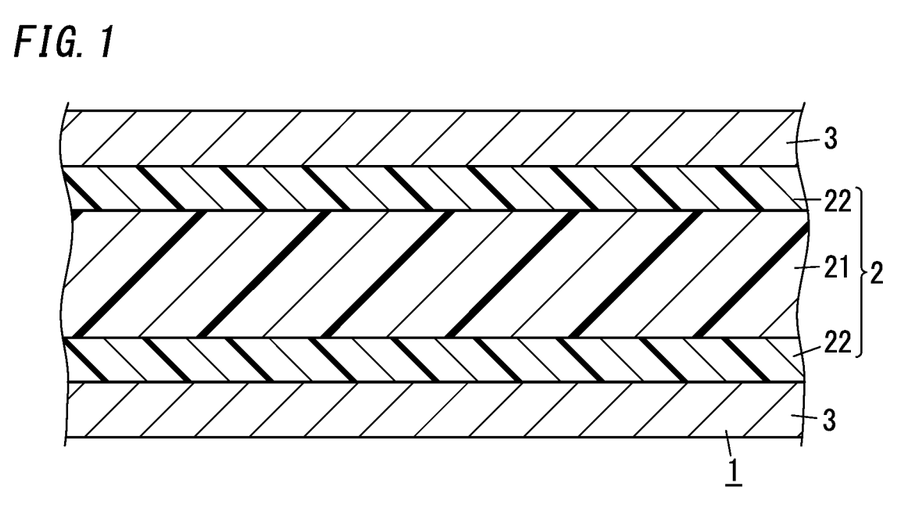
FIG. 1 is a schematic cross-sectional view of a metal-clad laminate according to an exemplary embodiment of the present disclosure.

As shown in FIG. 1, a metal-clad laminate 1 according to an exemplary embodiment includes: an insulating layer 2; and a metal layer 3 stacked on the insulating layer 2. The insulating layer 2 includes: a first layer 21; and a second layer 22 interposed between the first layer 21 and the metal layer 3. The first layer 21 contains a cured product of a first resin composition. The second layer 22 contains a cured product of a second resin composition. The first resin composition contains composite particles. Each of the composite particles has a core containing a fluororesin and a shell containing a silicon oxide that coats the core at least partially. The second resin composition either contains composite particles, each of which has a core containing the fluororesin and a shell containing the silicon oxide that coats the core at least partially, or contains no such composite particles. When the second resin composition contains the composite particles, a ratio of the composite particles in the second resin composition to solid content of the second resin composition is lower than a ratio of the composite particles in the first resin composition to solid content of the first resin composition.

This facilitates lowering the relative dielectric constant of the insulating layer 2 in the metal-clad laminate 1 and reduces the chances of causing a decrease in the peel strength of the metal layer 3 with respect to the insulating layer 2.

This advantage of this embodiment will be described in further detail. According to this embodiment, either the composite particles included in the first layer 21 or the composite particles included in each of the first layer 21 and the second layer 22 facilitate lowering the dielectric constant of the insulating layer 2. In addition, the second layer 22 in contact with the metal layer 3 has no interfaces between the composite particles and a mother phase or the number of such interfaces is smaller than that of the interfaces between the composite particles and the mother phase in the first layer 21. Thus, even if stress is caused in the second layer 22 upon the application of force to the metal layer 3, cleavage is hardly caused in the second layer 22. Furthermore, the composite particles in the first layer 21 each have a shell containing a silicon oxide as described above. This increases the chances of achieving a high degree of adhesion between the composite particles and the mother phase surrounding the particles in the first layer 21. As used herein, the "mother phase" of the first layer 21 refers to the rest of the cured product of the first resin composition other than the composite particles and the "mother phase" of the second layer 22 refers to the rest of the cured product of the second resin composition other than the composite particles. Thus, even if stress is caused in the first layer 21 upon the application of force to the metal layer 3, cleavage is hardly caused between the composite particles and the mother phase in the first layer 21.

Consequently, even if force is applied to the metal layer 3, cleavage is rarely caused by the composite particles in the vicinity of the interfaces between the insulating layer 2 and the metal layer 3, thus reducing the chances of the peel strength of the metal layer 3 with respect to the insulating layer 2 being decreased by the composite particles.

In this embodiment, the peel strength of the metal layer 3 with respect to the insulating layer 2 is preferably equal to or greater than 5 N/cm and the insulating layer 2 preferably has a relative dielectric constant equal to or less than 3.15. This embodiment makes the composite particles lower the relative dielectric constant of the insulating layer 2 and reduces the chances of the composite particles causing a decrease in the peel strength, thus achieving such a high peel strength and such a low relative dielectric constant at the same time. Methods for measuring the peel strength and the relative dielectric constant will be described in detail later with respect to specific examples. The peel strength is more preferably equal to or greater than 5.0 N/cm and even more preferably equal to or greater than 6.0 N/cm. The relative dielectric constant is more preferably equal to or less than 3.10 and even more preferably equal to or less than 3.05.

In this embodiment, the insulating layer 2 preferably has a coefficient of linear expansion of 14.0 ppm/° C. or less. This reduces the chances of causing warpage in the metal-clad laminate 1, thus improving the dimensional stability of the metal-clad laminate 1. Such a coefficient of linear expansion may be achieved by adjusting the content of an inorganic filler in the insulating layer 2, for example. The coefficient of linear expansion of the insulating layer 2 is more preferably equal to or less than 13.0 ppm/° C. and even more preferably equal to or less than 12.0 ppm/° C.

Next, this embodiment will be described in further detail.

The respective components of the first resin composition and the second resin composition will be described.

The first resin composition (hereinafter referred to as a "composition (X)") contains, for example, composite particles and a resin component. The resin component preferably has reactive curing properties and particularly preferably has thermosetting properties. The resin component does not have to be a polymer but may contain any of a monomer, an oligomer, or a prepolymer.

The resin component contains at least one component selected from the group consisting of, for example, an epoxy resin, a phenolic resin, a bismaleimide resin, a cyanate resin, and a modified polyphenylene resin. Optionally, the resin component may contain a curing agent and a cross-linking agent, for example.

In this embodiment, the resin component preferably contains: a modified polyphenylene ether compound (A) having, at one terminal, a group with an unsaturated double bond; and a cross-linking agent (B) having a carbon-carbon double bond. This facilitates increasing the heat resistance of the insulating layer 2 and makes it even easier to lower the dielectric constant and dielectric loss tangent of the insulating layer 2.

The modified polyphenylene ether compound (hereinafter referred to as a "compound (A)") will be described. The compound (A) facilitates lowering the dielectric constant and dielectric loss tangent of the cured product of the composition (X). The compound (A) is polyphenylene ether, of which one terminal is modified with a group having an unsaturated double bond (carbon-carbon unsaturated double bond). That is to say, the compound (A) has, for example, a polyphenylene ether chain and a group having an unsaturated double bond which is bonded to one terminal of the polyphenylene ether chain.

Examples of such a group having an unsaturated double bond include a substituent expressed by the following Formula (1):

where n is a number falling within the range from 0 to 10, Z is an arylene group, $R^1$ to $R^3$ are each independently a hydrogen atom or an alkyl group. If n is 0 in Formula (1), Z is directly bonded to the terminal of the polyphenylene ether chain.

The arylene group may be, for example, a monocyclic aromatic group such as a phenylene group, or a polycyclic aromatic group such as a naphthylene group. At least one hydrogen atom bonded to the aromatic ring in the arylene group may be replaced with a functional group such as an alkenyl group, an alkynyl group, a formyl group, an alkylcarbonyl group, an alkenylcarbonyl group, or an alkynylcarbonyl group. Note that these are only examples of the arylene group and should not be construed as limiting.

The alkyl group is preferably an alkyl group having 1 to 18 carbon atoms, and more preferably an alkyl group having 1 to 10 carbon atoms, for example. Specifically, the alkyl group may be, for example, a methyl group, an ethyl group, a propyl group, a hexyl group, or a decyl group. Note that these are only examples of the alkyl group and should not be construed as limiting.

The group having the unsaturated double bond may have, for example, a vinylbenzyl group (ethenylbenzyl group) such as a p-ethenylbenzyl group and an m-ethenylbenzyl group, a vinylphenyl group, an acrylate group, or a methacrylate group. The group having the unsaturated double bond preferably has a vinylbenzyl group, a vinylphenyl group, or a methacrylate group, among other things. If the group having the unsaturated double bond has an allyl group, the reactivity of the compound (A) tends to be low. Meanwhile, if the group having the unsaturated double bond has an acrylate group, the reactivity of the compound (A) tends to be too high.

A preferable specific example of the group having the unsaturated double bond may be a functional group including a vinylbenzyl group. Specifically, the group having the unsaturated double bond may be, for example, a substituent expressed by the following Formula (2):

(2)

where $R^1$ is a hydrogen atom or an alkyl group having 1 to 10 carbon atoms, and $R^2$ is an alkylene group having either a single bond or 1 to 10 carbon atoms. $R^2$ is preferably an alkylene group having 1 to 10 carbon atoms.

The group having the unsaturated double bond may be a (meth)acrylate group. The (meth)acrylate group is expressed by, for example, the following Formula (3):

(3)

where $R^4$ is a hydrogen atom or an alkyl group. The alkyl group is preferably an alkyl group having 1 to 18 carbon atoms, and more preferably an alkyl group having 1 to 10 carbon atoms. Specifically, the alkyl group may be, for example, a methyl group, an ethyl group, a propyl group, a hexyl group, or a decyl group. Note that these are only examples of the alkyl group and should not be construed as limiting.

As described above, the compound (A) has a polyphenylene ether chain in its molecule. The polyphenylene ether chain has, for example, a repeating unit expressed by the following Formula (4):

(4)

where n is a number falling within the range from 1 to 50 and $R^5$ to $R^8$ are each independently a hydrogen atom, an alkyl group, an alkenyl group, an alkynyl group, a formyl group, an alkylcarbonyl group, an alkenylcarbonyl group, or an alkynylcarbonyl group. Each of $R^5$ to $R^8$ is preferably a hydrogen atom or an alkyl group. The alkyl group is preferably an alkyl group having 1 to 18 carbon atoms, and more preferably an alkyl group having 1 to 10 carbon atoms, for example. Specifically, the alkyl group may be, for example, a methyl group, an ethyl group, a propyl group, a hexyl group, or a decyl group. The alkenyl group is preferably an alkenyl group having 2 to 18 carbon atoms, and more preferably an alkenyl group having 2 to 10 carbon atoms, for example. Specifically, the alkenyl group may be, for example, a vinyl group, an allyl group, or a 3-butenyl group. The alkynyl group is preferably an alkynyl group having 2 to 18 carbon atoms, and more preferably an alkynyl group having 2 to 10 carbon atoms, for example. Specifically, the alkynyl group may be, for example, an ethynyl group or a propa-2-in-1-yl group (propargyl group). The alkylcarbonyl group may be a carbonyl group replaced with an alkyl group and is preferably an alkylcarbonyl group having 2 to 18 carbon atoms, more preferably an alkylcarbonyl group having 2 to 10 carbon atoms. Specifically, the alkylcarbonyl group may be, for example, an acetyl group, a propionyl group, a butyryl group, an isobutyryl group, a pivaloyl group, a hexanoyl group, an octanoyl group, or a cyclohexylcarbonyl group. The alkenylcarbonyl group may be a carbonyl group replaced with an alkenyl group and is preferably an alkenylcarbonyl group having 3 to 18 carbon atoms, and more preferably an alkenylcarbonyl group having 3 to 10 carbon atoms, for example. Specifically, the alkenylcarbonyl group may be, for example, an acryloyl group, a methacryloyl group, or a crotonoyl group. The alkynylcarbonyl group may be a carbonyl group replaced with an alkynyl group and is preferably an alkynylcarbonyl group having 3 to 18 carbon atoms, and more preferably an alkynylcarbonyl group having 3 to 10 carbon atoms, for example. Specifically, the alkynylcarbonyl group may be, for example, a propioloyl group. Note that these are only examples of the alkyl group, alkenyl group, alkynyl group, formyl group, alkylcarbonyl group, alkenylcarbonyl group, and alkynylcarbonyl group and should not be construed as limiting.

The number average molecular weight of the compound (A) preferably falls within the range from 1000 to 5000, more preferably falls within the range from 1000 to 4000, and even more preferably falls within the range from 1000 to 3000. The number average molecular weight is obtained by converting the results of measurement by gel permeation chromatography (GPC) into a polystyrene equivalent value. If the compound (A) has the repeating unit expressed by the Formula (4,) in the molecule, n in the Formula (4) is preferably such a numerical value that allows the number average molecular weight of the compound (A) to fall within the above preferred range. Specifically, it is preferable that n fall within the range from 1 to 50. If the number average molecular weight of the compound (A) falls within such a range, the compound (A) imparts excellent dielectric properties to the cured product of the composition (X) by the polyphenylene ether chain, and further improves the heat resistance and moldability of the cured product. The reason is probably as follows. If the number average molecular weight of the unmodified polyphenylene ether falls within the range from about 1000 to about 5000, the polyphenylene ether has a relatively low molecular weight and tends to decrease the heat resistance of the cured product. On the other hand, the compound (A) has an unsaturated double bond at one terminal, which would increase the heat resistance of the cured product. Further, if the number average molecular weight of the compound (A) is 5000 or less, the moldability of the composition (X) would not be easily impaired. Therefore, the compound (A) would be able to improve not only the heat resistance of the cured product but also the moldability of the composition (X) as well. If the number average molecular weight of the compound (A) is 1000 or less, the glass transition temperature of the cured product is unlikely to decrease, and therefore, the cured product tends to have good heat resistance. In addition, since the polyphenylene ether chain in the compound (A) is unlikely to shorten, the cured product may easily maintain excellent dielectric properties due to the presence of the polyphenylene ether chain. Furthermore, if the number average molecular weight is 5000 or less, the compound (A) is easily dissolved in a solvent, and the storage stability of the composition (X) is unlikely to decrease. Besides, the compound (A) does not easily increase the viscosity of the composition (X), thus facilitating imparting good moldability to the composition (X).

It is preferable that the compound (A) contain no high molecular weight component having a molecular weight of 13000 or more or that the content of the high molecular weight component having a molecular weight of 13000 or more in the compound (A) be 5% by mass or less. That is to say, the content of the high molecular weight component having a molecular weight of 13000 or more in the compound (A) preferably falls within the range from 0% by mass to 5% by mass. In this case, the cured product may have particularly excellent dielectric properties, and the composition (X) may have particularly excellent reactivity and storage stability and may further have particularly excellent flowability. More preferably, the content of the high molecular weight component is 3% by mass or less. The content of the high molecular weight component may be calculated based on the molecular weight distribution measured by, for example, gel permeation chromatography (GPC).

The average number of groups having an unsaturated double bond (number of terminal functional groups) per molecule of compound (A) is preferably 1 or more, more preferably 1.5 or more, even more preferably 1.7 or more, and particularly preferably 1.8 or more. In these cases, it is easy to ensure sufficient heat resistance for the cured product of the composition (X). The average number of groups having unsaturated double bonds is preferably 5 or less, more preferably 3 or less, even more preferably 2.7 or less, and particularly preferably 2.5 or less. In these cases, it is possible to prevent the reactivity and viscosity of the compound (A) from becoming excessively high, thus reducing the chances of causing inconveniences such as a decline in the storage stability of the composition (X) and/or the flowability of the composition (X). In addition, this also reduces the chances of leaving unreacted unsaturated double bonds after the composition (X) has been cured. The number of terminal functional groups of the compound (A) is the average value of substituents per molecule in 1 mol of the compound (A). This number of terminal functional groups may be obtained by, for example, if the compound (A) is synthesized by modifying the polyphenylene ether, measuring the number of hydroxyl groups in the compound (A), and by calculating the decrease in the number of hydroxyl groups in the compound (A) from the number of hydroxyl groups in the polyphenylene ether before modification. The decrease from the number of hydroxyl groups in the polyphenylene ether before modification is the number of terminal functional groups. The number of hydroxyl groups remaining in compound (A) may be determined by measuring the UV absorbance of a mixed solution obtained by adding a quaternary ammonium salt (tetraethylammonium hydroxide) that associates with hydroxyl groups to the solution of the compound (A).

The intrinsic viscosity of the compound (A) preferably falls within the range from 0.03 dl/g to 0.12 dl/g, more preferably falls within the range from 0.04 dug to 0.11 dl/g, and even more preferably falls within the range from 0.06 dl/g to 0.095 dug. This facilitates lowering the dielectric constant and dielectric loss tangent of the cured product of the composition (X). In addition, the moldability of the composition (X) may be improved by imparting sufficient flowability to the composition (X).

Note that the intrinsic viscosity is measured in methylene chloride at 25° C., and more specifically, is the viscosity at 25° C. of a solution prepared by, for example, dissolving the compound (A) in methylene chloride at a concentration of 0.18 g/45 ml. This viscosity may be measured, for example, with a viscometer such as AVS500 Visco System manufactured by Schott Instruments GmbH.

Any method may be used without limitation to synthesize the compound (A). For example, the compound (A) may be synthesized by reacting polyphenylene ether with a compound in which a group having an unsaturated double bond and a halogen atom are bonded. More specifically, the polyphenylene ether and the compound in which the group having the unsaturated double bond and the halogen atom are bonded are dissolved in a solvent and stirred up. As a result, the polyphenylene ether reacts with the compound in which the group having the unsaturated double bond and the halogen atom are bonded, thus obtaining the compound (A).

The cross-linking agent (B) having a carbon-carbon double bond (hereinafter referred to as "cross-linking agent (B)") forms a cross-linked structure by reacting with the compound (A).

The cross-linking agent (B) contains at least one component selected from the group consisting of, for example, divinylbenzene, polybutadiene, alkyl (meth)acrylate, tricyclodecanol (meth)acrylate, fluorene (meth)acrylate, isocyanurate (meth)acrylate, and trimethylolpropane (meth)acrylate.

Among these components, the cross-linking agent (B) preferably contains polybutadiene in order to lower the dielectric constant. The percentage of the cross-linking agent (B) preferably falls within the range from 5% by mass to 70% by mass, more preferably falls within the range from 10% by mass to 60% by mass, and even more preferably falls within the range from 10% by mass to 50% by mass, with respect to the total content of the compound (A) and the cross-linking agent (B). In these cases, not only the moldability of the composition (X) but also the heat resistance of the cured product may be significantly improved, with the cured product allowed to maintain excellent dielectric properties due to the presence of the compound (A).

If the resin component contains the compound (A) and the cross-linking agent (B), then the composition (X) may further contain a reaction initiator (H). The reaction initiator (H) may contain an appropriate compound capable of accelerating the curing reaction between the compound (A) and the cross-linking agent (B). Specifically, the reaction initiator (H) may contain at least one compound selected from the group consisting of, for example, oxidants such as $\alpha, \alpha'$-bis (t-butylperoxy-m-isopropyl) benzene, 2,5-dimethyl-2,5-di (t-butylperoxy)-3-hexin, benzoyl peroxide, 3,3',5,5'-tetramethyl-1,4-diphenoquinone, Chloranil, 2,4,6-tri-t-butylphenoxyl, t-butylperoxyisopropyl monocarbonate, and azobisisobutyronitrile. If necessary, the reaction initiator (H) may contain, for example, a carboxylic acid metal salt in addition to the oxidant. This may further accelerate the curing reaction. Note that these are only exemplary components to be contained in the reaction initiator (H) and should not be construed as limiting.

The reaction initiator (H) preferably contains $\alpha, \alpha'$-bis (t-butylperoxy-m-isopropyl) benzene, among other things. In that case, $\alpha, \alpha'$-bis (t-butylperoxy-m-isopropyl) benzene, having a relatively high reaction start temperature, reduces the chances of the curing reaction proceeding excessively when the composition (X) is heated to be dried or semi-cured. Furthermore, $\alpha, \alpha'$-bis (t-butylperoxy-m-isopropyl) benzene has low volatility, and therefore, hardly vaporizes during storage and heating of the composition (X) and rarely impairs the stability of the composition (X).

The composition (X) contains composite particles as described above. The composite particles each have a core containing a fluororesin and a shell containing a silicon oxide that coats the core at least partially as described above. The core preferably consists essentially of the fluororesin but may contain some additional components other than the fluororesin as long as the advantages of this embodiment are not impaired. The shell preferably consists essentially of the silicon oxide but may contain some additional components other than the silicon oxide as long as the advantages of this embodiment are not impaired. The composite particles facilitate lowering the relative dielectric constant of the insulating layer 2. In addition, the composite particles each have a shell containing the silicon oxide, thus increasing the chances of achieving a high degree of affinity between the mother phase and the composite particles in the first layer 21. This reduces, even when stress is caused in the first layer 21, the chances of causing cleavage in the interfaces between the composite particles and the mother phase.

The fluororesin as a constituent material for the core may contain, for example, polytetrafluoroethylene. This particularly significantly increases the chances of lowering the relative dielectric constant of the insulating layer 2.

The shell is formed out of, for example, silicon oxide particles having a smaller particle size than the core. In this case, for example, irradiating, with an electron beam, the silicon oxide particles arranged on the surface of the particles (fluororesin particles) consisting of only the core causes the silicon oxide particles to adhere to the fluororesin particles, thus forming a shell. As a result, composite particles each having a core and a shell are obtained. Note that this an exemplary method of forming the shell and should not be construed as limiting. The composite particles may be obtained by adhering the silicon oxide particles onto the fluororesin particles or precipitating the silicon oxide particles on the fluororesin particles. For this purpose, for example, a method of obtaining composite particles by spraying silicon oxide particles onto molten fluororesin particles and combining the silicon oxide particles with the fluororesin particles may be used. Alternatively, a method of obtaining composite particles by precipitating the silicon oxide on the surface of fluororesin particles when the fluororesin particles are dispersed and precipitated in a liquid may also be used. Still alternatively, the shell may be in a state in which silicon oxide particles are densely adhered and supported around the core. Yet alternatively, the shell may form a layer in which the silicon oxide particles are continuously connected together to surround the core.

The shell preferably has at least one functional group selected from the group consisting of a hydroxyl group, a phenylamino group, and a vinyl group. This facilitates increasing the degree of adhesion between the composite particles and the mother phase, thus further reducing the chances of causing cleavage in interfaces between the composite particles and the mother phase.

If the shell has a hydroxyl group, the shell is formed out of, for example, untreated silicon oxide particles. In this case, the shell may have a hydroxyl group derived from a hydroxyl group originally present on the surface of the silicon oxide particles.

If the shell has a phenylamino group, the shell may be, for example, treated with phenylamino. That is to say, the shell includes a silicon oxide treated with a compound having a phenylamino group ($C_6H_5$—NH—), for example. As the compound having a phenylamino group, N-phenyl-3-aminopropyltrimethoxysilane (KBM-573: manufactured by Shin-Etsu Chemical Co., Ltd.), for example, may be used. For example, when composite particles are obtained from the fluororesin particles and the silicon oxide particles as described above, the silicon oxide particles are subjected to phenylamino treatment and then the silicon oxide particles are adhered to the surface of the fluororesin particles. In this manner, composite particles with a shell having a phenylamino group may be obtained.

If the shell has a vinyl group, the shell may contain, for example, a silicon oxide treated with a compound having a vinyl group. As the compound having a vinyl group, vinyl trimethoxysilane (KBM-1003 manufactured by Shin-Etsu Chemical Co., Ltd.), for example, may be used. For example, when composite particles are obtained from fluororesin particles and silicon oxide particles as described above, the silicon oxide particles may be treated with a compound having a vinyl group, and then the silicon oxide particles may be adhered to the surface of the fluororesin particles. In this manner, composite particles with a shell having a vinyl group may be obtained.

The composite particles preferably have a median size falling within the range from 0.2 µm to 15 µm. If the median size is equal to or greater than 0.2 µm, the composite particles have good dispersion in the composition (X), thus allowing the composition (X) to have good storage stability and handleability. Also, if the median size is equal to or less than 15 µm, the composite particles may be sufficiently dispersed in the first layer 21. This enables further lowering the relative dielectric constant of the insulating layer 2. The median size more preferably falls within the range from 0.5 µm to 5 µm.

The median size is a value calculated based on the volume-based particle size distribution measured by the laser diffraction/scattering method.

The particle size of the composite particles may also be measured with a transmission electron microscope (TEM) or a scanning transmission electron microscope (STEM). Specifically, the composite particles are shot with a TEM or an STEM, and the longest size of the core portion of the composite particles is measured based on the image thus captured. The arithmetic mean value of these results of measurement may be regarded as the mean particle size of the core. The mean particle size may be determined based on the measurement results obtained from at least 30 cores. Furthermore, the longest size of the silicon oxide particles in the composite particles is measured. The arithmetic mean value of these results of measurement may be regarded as the mean particle size of the silicon oxide particles. The mean particle size may be determined based on the measurement results obtained from at least 30 silicon oxide particles.

The content of the composite particles preferably falls within the range from 10 parts by mass to 250 parts by mass with respect to 100 parts by mass in total of the compounds (A) and (B). Setting the content of the composite particles at 10 parts by mass or more makes it significantly easier to lower the dielectric constant of the insulating layer 2. In addition, setting the content of the composite particles at 250 parts by mass or less reduces the chances of causing a decrease in the peel strength of the metal layer 3 with respect to the insulating layer 2. The content of the composite particles more preferably falls within the range from 20 parts by mass to 200 parts by mass and even more preferably falls within the range from 30 parts by mass to 100 parts by mass.

The composition (X) preferably does not contain fluororesin particles having no shell (i.e., particles corresponding to composite particles each consisting of only a core). Even if the composition (X) contains fluororesin particles, the ratio of the fluororesin particles to 100 parts by mass in total of the compounds (A) and (B) is preferably equal to or less than 20 parts by mass. This further reduces the chances of causing cleavage in the first layer 21, thus particularly significantly reducing the chances of causing a decrease in the peel strength of the metal layer 3 with respect to the insulating layer 2.

Optionally, the composition (X) may contain an inorganic filler (F). The inorganic filler (F) may increase the heat resistance and flame retardancy of the first layer 21 and decrease the coefficient of linear expansion of the insulating layer 2.

The inorganic filler (F) may contain at least one component selected from the group consisting of, for example, silica, alumina, talc, aluminum hydroxide, magnesium hydroxide, titanium oxide, mica, aluminum borate, barium sulfate, and calcium carbonate. The inorganic filler (F) may be surface-treated with a silane coupling agent. The silane coupling agent may increase the heat resistance of the insulating layer 2 at the time of moisture absorption when the insulating layer 2 of the laminate is formed out of the composition (X) and may also enhance the peel strength of a sheet of metal foil stacked on the insulating layer 2 with respect to the insulating layer 2. The silane coupling agent contains at least one component selected from the group consisting of, for example, vinylsilane, styrylsilane, methacrylic silane, and acrylic silane.

If the composition (X) contains the inorganic filler (F), the percentage of the inorganic filler (F) with respect to the total solid content of the composition (X) may fall within the range from 5% by mass to 56% by mass, for example.

The composition (X) may contain a solvent (D). The solvent (D) is preferably able to dissolve or disperse the resin components sufficiently, and preferably does not inhibit the reaction between the resin components. For example, the solvent (D) preferably contains at least one component selected from the group consisting of an aliphatic hydrocarbon solvent, an aromatic hydrocarbon solvent, and a ketone solvent, and particularly preferably contains toluene. The components to be contained in the solvent (D) are not limited to these. The composition (X) containing a solvent makes it easier to impregnate the base material with the composition (X) when a prepreg is formed from the composition (X). The content of the solvent in the composition (X) preferably falls within the range from 100% by mass to 500% by mass with respect to the total solid content. This makes the composition (X) homogenized enough to be easily impregnated into a fibrous base material.

The composition (X) may contain a silane coupling agent (G). In that case, the silane coupling agent (G) is a component not used for the surface treatment of the inorganic filler (F). In that case, the silane coupling agent (G) may increase the heat resistance of the insulating layer 2 at the time of moisture absorption when the insulating layer 2 of the metal-clad laminate 1 is formed out of the composition (X) and may further increase the peel strength of the metal layer 3 with respect to the insulating layer 2. The silane coupling agent (G) contains at least one component selected from the group consisting of, for example, vinylsilane, styrylsilane, methacrylic silane, and acrylic silane.

The percentage of the silane coupling agent (G) with respect to the resin components preferably falls within the range from 0.3% by mass to 5% by mass. Using such a silane coupling agent (G) may further increase the peel strength of the metal layer 3 with respect to the insulating layer 2.

The composition (X) may contain additive(s) other than these components. The additive(s) contain at least one component selected from the group consisting of, for example, polymerization inhibitors, flame retardants, defoamers such as silicone-based defoamers and acrylic acid ester-based defoamers, heat stabilizers, antistatic agents, ultraviolet absorbers, dyes and pigments, lubricants, and dispersants such as wet dispersants. Note that these are only exemplary components to be contained in the additive(s) and should not be construed as limiting.

The composition (X) may be prepared, for example, as follows. First, components that may be dissolved in an organic solvent, such as the compound (A) and the cross-linking agent (B), are mixed with the organic solvent to prepare a mixture. At this time, the mixture may be heated as appropriate. Thereafter, an optional component not dissolved in the organic solvent, such as an inorganic filler, is added to the mixture and then dispersed using a ball mill, a bead mill, a planetary mixer, or a roll mill, for example, to prepare a composition (X) in a varnish state.

A prepreg may be formed from the composition (X). The prepreg includes a base material, and a dried or semi-cured product of the composition (X) impregnated into the base material. The prepreg may be formed by, for example, impregnating the base material with the composition (X) and then heating the composition (X).

The base material may be, for example, a fibrous base material. The fibrous base material is selected from the group consisting of, for example, a glass fiber base material (either glass cloth or glass nonwoven fabric), aramid cloth, polyester cloth, aramid non-woven fabric, polyester non-woven fabric, pulp paper, and linter paper. Making the fibrous base material of glass fiber base material facilitates increasing the mechanical strength of the metal-clad laminate 1 formed out of the prepreg. Using glass cloth as the glass fiber base material makes it particularly easy to increase the mechanical strength of the metal-clad laminate 1. The glass cloth is preferably flattened. The thickness of the fibrous base material may fall within the range from, for example, 0.04 mm to 0.3 mm.

The base material may be impregnated with the composition (X) by, for example, immersing the base material in the composition (X) or applying the composition (X) onto the base material. If necessary, the base material may be immersed in the composition (X) multiple times or the composition (X) may be applied onto the base material multiple times.

Subsequently, the composition (X) impregnated into the base material is heated to cause the composition (X) to be dried or semi-cured. The heating condition may, but does not have to, include a heating temperature of 80° C. or higher and a heating time of 1 to 10 minutes. In this manner, a prepreg including the base material and a dried or semi-cured product of the composition (X) impregnated into the base material is obtained.

The second resin composition (hereinafter referred to as a "composition (Y)") either contains the composite particles or contains no composite particles as described above. If the composition (Y) contains the composite particles, the ratio of the composite particles in the composition (Y) to the solid content of the composition (Y) is lower than the ratio of the composite particles in the composition (X) to the solid content of the composition (X). As used herein, the solid content of the composition (X) refers to the components of the composition (X) other than the solvent thereof, and the solid content of the composition (Y) refers to the components of the composition (Y) other than the solvent thereof.

The chemical makeup of the components of the composition (Y) other than the composite particles may be the same as in the case of the composition (X) described above. The chemical makeups of the compositions (X) and (Y) to be used simultaneously other than the composite particles thereof may be the same as, or different from, each other.

It is particularly preferable that the composition (Y) contain no composite particles. If the composition (Y) contains composite particles, the ratio of the composite particles to the solid content in the composition (Y) is preferably equal to or less than 5% by mass. Also, the ratio of the composite particles to the solid content in the composition (Y) is preferably equal to or less than 9% by mass with respect to the composite particles in the composition (X).

The composition (Y) preferably does not contain fluororesin particles having no shell (i.e., particles corresponding to composite particles each consisting of only a core). Even if the composition (X) contains fluororesin particles, the ratio of the fluororesin particles to the solid content in the composition (Y) is preferably equal to or less than 5% by mass. This allows cleavage to be even more rarely caused in the second layer 22, thus particularly significantly reducing the chances of causing a decrease in the peel strength of the metal layer 3 with respect to the insulating layer 2. This ratio is more preferably equal to or less than 4% by mass.

A resin sheet may be formed out of the composition (Y). For example, the composition (Y) may be applied onto an appropriate carrier film such as a resin film and then heated to be dried or semi-cured. The heating condition may, but does not have to, include a heating temperature falling within the range from 80° C. to 180° C. and a heating time falling within the range from 1 minute to 10 minutes. In this manner, a resin sheet may be formed on the carrier film out of a dried or semi-cured product of the composition (Y).

Alternatively, the composition (Y) may be applied onto a sheet of metal foil such as copper foil and then heated to be dried or semi-cured. In that case, a resin sheet may be formed on the sheet of metal foil out of a dried or semi-cured product of the composition (Y). Also, a resin sheet with a sheet of metal foil, including a sheet of metal foil and a resin sheet stacked on the sheet of metal foil, is formed in this manner.

Optionally, a prepreg may be formed out of the composition (Y) by the same method as in a situation where a prepreg is formed out of the composition (X).

The configuration of the metal-clad laminate 1 will be described. As described above, the metal-clad laminate 1 includes an insulating layer 2 and a metal layer 3 stacked on the insulating layer 2. The insulating layer 2 includes a first layer 21 and a second layer 22 interposed between the first layer 21 and the metal layer 3. That is to say, the metal layer 3, the second layer 22, and the first layer 21 are stacked one on top of another in this order. The first layer 21 includes a cured product of the composition (X) and the second layer 22 includes a cured product of the composition (Y).

The metal-clad laminate 1 may be a double-sided metal-clad laminate such as the one shown in FIG. 1. In that case, the insulating layer 2 may include, for example, a first layer 21 and two second layers 22 and the first layer 21 is interposed between the two second layers 22. In addition, the metal-clad laminate 1 further includes two metal layers 3, which are respectively stacked on the two second layers 22. That is to say, the metal layer 3, the second layer 22, the first layer 21, the second layer 22, and the metal layer 3 are stacked one on top of another in this order.

The first layer 21 may include a fibrous base material. In particular, the first layer 21 preferably includes a glass fiber base material. This facilitates increasing the strength of the insulating layer 2. The glass fiber base material includes at least one of glass cloth or glass nonwoven fabric.

The second layer 22 preferably includes no glass fiber base material. In that case, there are no interfaces between the glass fiber base material and the cured product of the composition (Y) in the second layer 22 and no cleavage is caused at interfaces. This further reduces the chances of causing a decrease in the peel strength of the metal layer 3 with respect to the insulating layer 2. The second layer 22 preferably includes no fibrous base materials other than glass fiber base material.

The second layer 22 preferably has a thickness falling within the range from 1 μm to 25 μm. Setting the thickness of the second layer 22 at 1 μm or more further reduces the chances of causing a decrease in the peel strength of the metal layer 3 with respect to the insulating layer 2. Also, setting the thickness of the second layer 22 at 25 μm or less makes it particularly easy for the first layer 21 to lower the dielectric constant of the insulating layer 2. This thickness more preferably falls within the range from 3 μm to 23 μm and even more preferably falls within the range from 5 μm to 20 μm.

The insulating layer 2 preferably has a thickness falling within the range from 15 μm to 250 μm. This reduces the chances of causing a dispersion in the thickness of the insulating layer 2. This thickness more preferably falls within the range from 25 μm to 230 μm and even more preferably falls within the range from 35 μm to 220 μm.

The thickness of the first layer 21 is preferably greater than that of the second layer 22. This makes it particularly easy for the first layer 21 to lower the dielectric constant of the insulating layer 2. The first layer 21 preferably has a thickness falling within the range from 10 μm to 240 μm. Setting the thickness of the first layer 21 at 10 μm or more makes it particularly easy for the first layer 21 to lower the dielectric constant of the insulating layer 2. Also, setting the thickness of the first layer 21 at 240 μm or less reduces the chances of causing a dispersion in the thickness of the first layer 21. This thickness of the first layer 21 more preferably falls within the range from 20 μm to 230 μm and even more preferably falls within the range from 30 μm to 210 μm.

Note that in the metal-clad laminate 1 implemented as a double-sided metal-clad laminate, if the second layer 22 is interposed between one metal layer 3 out of the two metal layers 3 and the first layer 21, the other metal layer 3 may be directly in contact with the first layer 21. That is to say, the metal layer 3, the second layer 22, the first layer 21, and the metal layer 3 may be stacked one on top of another in this order.

The metal-clad laminate 1 shown in FIG. 1 may be manufactured, for example, by the following method.

A sheet of metal foil such as copper foil, a prepreg formed of the composition (X) and the base material, and a resin sheet formed out of the composition (Y) are prepared. The prepreg and the resin sheet are as already described above.

A multi-layer stack is obtained by stacking a sheet of metal foil, a single or multiple resin sheets, a single or multiple prepregs, a single or multiple resin sheets, and a sheet of metal foil one on top of another in this order. This multi-layer stack is hot pressed. The highest heating temperature at the time of hot pressing may fall within the range from 160° C. to 230° C., for example. The press pressure at the time of hot pressing may fall within the range from 0.5 MPa to 6 MPa, for example. The heating time at the time of hot pressing may fall within the range from 30 minutes to 240 minutes. Thus, the first layer 21 is formed by curing the prepreg and the second layer 22 is formed by curing the resin sheet. Furthermore, the metal layer 3 is formed out of the sheet of metal foil by bonding the sheet of metal foil to the second layer 22. In this manner, the metal-clad laminate 1 shown in FIG. 1 is manufactured.

Alternatively, the metal-clad laminate 1 may also be manufactured by the following method.

A prepreg formed of the composition (X) and the base material and a resin sheet with a sheet of metal foil formed of the composition (Y) and the sheet of metal foil are prepared. The prepreg and the resin sheet with the sheet of metal foil are as already described above.

Two resin sheets, each having a sheet of metal foil, are arranged to face each other. A single or multiple prepregs are placed between the two resin sheets, each having a sheet of metal foil. In this state, these resin sheets and the prepreg(s) are stacked one on top of another to obtain a multi-layer stack. The multi-layer stack is then hot pressed. The highest heating temperature at the time of hot pressing may fall within the range from 160° C. to 230° C., for example. The press pressure at the time of hot pressing may fall within the range from 0.5 MPa to 6 MPa, for example. The heating time at the time of hot pressing may fall within the range from 30 minutes to 240 minutes. Thus, the first layer 21 is formed by curing the prepreg and the second layer 22 is formed by curing the resin sheet in the resin sheet with the sheet of metal foil. Furthermore, the metal layer 3 is formed out of the sheet of metal foil in the resin sheet with the sheet of metal foil. In this manner, the metal-clad laminate 1 shown in FIG. 1 is manufactured.

Note that the condition for hot pressing the multi-layer stack does not have to be as described above but may also be set as appropriate such that the first layer 21 and the second layer 22 are formed out of the prepreg and the resin sheet, respectively. Also, the method for manufacturing the metal-clad laminate 1 does not have to be the above-described one, as long as an insulating layer 2, including the first layer 21 containing a cured product of the composition (X) and the second layer 22 containing a cured product of the composition (Y), may be formed.

Figure 2:
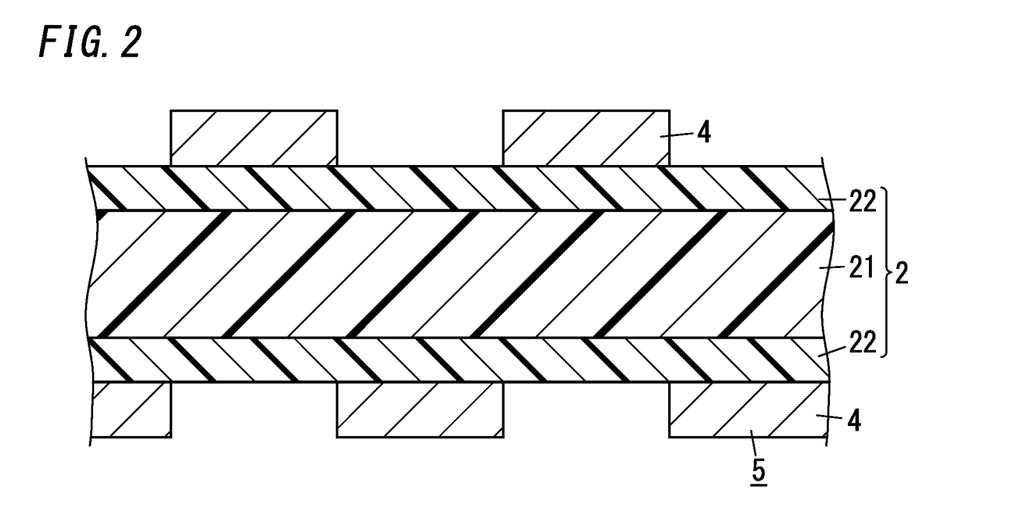
FIG. 2 is a schematic cross-sectional view of a printed wiring board according to an exemplary embodiment of the present disclosure.

A printed wiring board 5 as shown in FIG. 2 may be manufactured by forming conductor wiring 4 out of the metal layer 3 of this metal-clad laminate 1 by photolithographic process, for example. In that case, the printed wiring board 5 includes the insulating layer 2 and the conductor wiring 4 stacked on the insulating layer 2 and the insulating layer 2 includes the first layer 21 and the second layer 22 interposed between the first layer 21 and the conductor wiring 4.

In the foregoing description, the first layer 21 includes a fibrous base material. However, the first layer 21 does not have to include any fibrous base material. In that case, the first layer 21 may be formed out of a resin sheet formed out of a dried or semi-cured product of the composition (X), for example. Also, in the foregoing description, the second layer 22 includes no fibrous base material. However, the second layer 22 may include a fibrous base material. In that case, the second layer 22 may be formed out of a prepreg including a fibrous base material and a dried or semi-cured product of the composition (Y) impregnated into the fibrous base material.

EXAMPLES

Next, specific examples of the exemplary embodiment will be described. Note that the examples to be described below are only examples of the present disclosure and should not be construed as limiting.

1. Materials

As materials for the first resin composition and the second resin composition, components shown in the columns of the first and second resin compositions in Tables 1-3 were prepared. The details of the components shown in Tables 1-3 are as follows.

Modified PPE: Modified Polyphenylene Ether Synthesized by the Following Procedure.

Polyphenylene ether was reacted with chloromethylstyrene to obtain a modified polyphenylene ether.

Specifically, first, 200 g of polyphenylene ether (a polyphenylene ether having the structure expressed by the following Formula (5); SA90 manufactured by SABIC Innovative Plastics; having an intrinsic viscosity (IV) of 0.083 dl/g, a number of terminal hydroxyl groups per molecule of 1.9, and a weight average molecular weight Mw of 2000), 30 g of a mixture having a mass ratio of 50:50 of p-chloromethylstyrene and m-chloromethylstyrene (chloromethylstyrene: CMS manufactured by Tokyo Chemical Industry Co., Ltd.), and 1.227 g of tetra-n-butylammonium bromide and 400 g of toluene as phase transfer catalysts were put into a three-necked flask having a capacity of 1 liter equipped with a temperature controller, a stirrer, a cooling facility, and a dropping funnel. In this manner, a reaction solution was obtained.

The reaction solution was stirred up until polyphenylene ether, chloromethylstyrene, and tetra-n-butylammonium bromide were dissolved in toluene. At that time, the reaction solution was gradually heated until the solution temperature finally reached 75° C. Then, an aqueous sodium hydroxide (containing 20 g of sodium hydroxide and 20 g of water) was added dropwise as an alkali metal hydroxide to the reaction solution for 20 minutes. Then, the reaction solution was further stirred up at 75° C. for 4 hours. Next, after the reaction solution was neutralized with an aqueous hydrochloric acid having a concentration of 10% by mass, a lot of methanol was added thereto. In this manner, a precipitate was formed in the reaction solution. That is to say, the product contained in the reaction solution was reprecipitated. Then, the precipitate was taken out from the reaction solution by filtration, washed three times with a mixed solution containing methanol and water at a mass ratio of 80 to 20, and then dried at 80° C. for 3 hours under a reduced pressure.

The solid thus obtained was analyzed with 1H-NMR (400 MHz, $CDCl_3$, TMS). As a result, a peak derived from ethenylbenzyl was recognized at 5 to 7 ppm. Thus, it was confirmed that the solid thus obtained was a modified polyphenylene ether having the group expressed by the Formula (1) at a terminal of its molecule. Specifically, it was confirmed that the modified polyphenylene ether was a polyphenylene ether that had been turned into ethenylbenzyl.

In addition, the number of terminal functional groups of the modified polyphenylene ether was measured as follows.

First, the modified polyphenylene ether was accurately weighed. The weight of the modified polyphenylene ether at that time was supposed to be X (mg). Then, the modified polyphenylene ether thus weighed was dissolved in 25 mL of methylene chloride, and 100 μL of an ethanol solution of 10% by mass of tetraethylammonium hydroxide (TEAH) (where TEAH: ethanol (volume ratio)=15:85) was added to the solution thus obtained, and then the absorbance (Abs) of the solution at 318 nm was measured with a UV spectrophotometer (UV-1600 manufactured by Shimadzu Corporation). Then, based on the measurement results, the volume of terminal hydroxyl group per weight of the modified polyphenylene ether was calculated by the following formula.

Volume of terminal hydroxyl group (μmol/g)=[(25×Abs)/(ε×OPL×X)]×10$^6$ where ε indicates an absorption coefficient, which was 4700 L/mol·cm in this test, and OPL is the cell optical path length, which was 1 cm in this test.

Since the volume of terminal hydroxyl groups was calculated to be approximately zero, almost all the hydroxyl groups of the polyphenylene ether before modification turned out to have been modified. Thus, it was discovered that the number of terminal hydroxyl groups of the polyphenylene ether yet to be modified was equal to the number of terminal functional groups of the modified polyphenylene ether. That is to say, the number of terminal functional groups per molecule of the modified polyphenylene ether was 1.9.

In addition, the intrinsic viscosity (IV) at 25° C. of a methylene chloride solution of the modified polyphenylene ether was measured. Specifically, a methylene chloride solution (with a liquid temperature of 25° C.) with a concentration of 0.18 g/45 ml of the modified polyphenylene ether had its intrinsic viscosity measured with a viscometer (AVS500 Visco System manufactured by Schott Instruments GmbH). As a result, the intrinsic viscosity (IV) was 0.086 dl/g.

In addition, the molecular weight distribution of the modified polyphenylene ether was measured by GPC (gel permeation chromatography). Based on the molecular weight distribution thus obtained, a weight average molecular weight (Mw) and the content of high molecular weight components having a molecular weight of 13000 or more were calculated. Furthermore, the content of the high molecular weight components was specifically calculated based on the ratio of a peak area represented by a curve showing the molecular weight distribution obtained by GPC. As a result, Mw was 2300. The content of the high molecular weight components was 0.1% by mass.

Cross-linking agent #1: polybutadiene oligomer: product number B-1000 manufactured by Nippon Soda Co., Ltd.;

Cross-linking agent #2: tricyclodecane dimethanol diacrylate, product name Light Acrylate A-DCP manufactured by Shin-Nakamura Chemical Industry Co., Ltd.;

Flame Retardant #1: phosphinate compound (aluminum trisdiethyl phosphinate), product name Exolit OP935 manufactured by Clariant Chemicals;

Flame retardant #2: phosphoric acid ester compound (aromatic condensed phosphoric acid ester compound), product number PX-200 manufactured by Daihachi Chemical Industry Co., Ltd.;

Inorganic filler: spherical silica, having a median size of 3 μm; product number SC2300-SVJ manufactured by Admatechs;

Silane coupling agent: 3-methacryloxypropyltrimethoxysilane, product number KBM-503 manufactured by Shin-Etsu Chemical Co., Ltd.;

Fluororesin particles: product name Levron TML-2 manufactured by Daikin Industries, Ltd., having a particle size of 3.5 μm.

Composite particles #1: composite particles having a core made of polytetrafluoroethylene and a shell made of silica particles treated with phenylamino and having a median size of 3.0 μm;

Composite particles #2: composite particles having a core made of polytetrafluoroethylene and a shell made of silica particles treated with phenylamino and having a median size of 1.0 μm; and Composite particles #3: composite particles having a core made of polytetrafluoroethylene and a shell made of silica particles treated with phenylamino and having a median size of 15.0 μm.

2. Forming Prepreg

A first resin composition was prepared by mixing the components shown in the "Chemical makeup of first resin composition" column in Tables 1-3. A prepreg was formed by impregnating the first resin composition into the fibrous base material (glass cloth) shown in the "Fibrous base material" in Tables 1-3 and heating the first resin composition at 150° C. for 1 minute.

3. Forming Resin Sheet

In a first example and a fourth comparative example, a second resin composition was prepared by mixing the components shown in the "Chemical makeup of second resin composition" column in Tables 1-3. A resin sheet with a thickness of 15 μm was formed by applying the second resin composition onto a carrier film and then heating the resin composition at 150° C. for three minutes.

4. Manufacturing Metal-Clad Laminate 1

In the first example and the fourth comparative example, a sheet of copper foil (with a thickness of 18 μm), a resin sheet, prepregs, of which the number was as indicated in the "Number of prepregs" column in Tables 1-3, and a resin sheet with a sheet of copper foil (with a thickness of 18 μm) were stacked one on top of another in this order to form a multi-layer stack. Then, the multi-layer stack was hot pressed under the condition including a heating temperature of 250° C., a press pressure of 4 mPa, and a heating time of 5 minutes, thereby forming a metal-clad laminate 1.

In first to third comparative examples, a sheet of copper foil (with a thickness of 18 μm), prepregs, of which the number was as indicated in the "Number of prepregs" column in Tables 1-3, and a sheet of copper foil (with a thickness of 18 μm) were stacked one on top of another in this order to form a multi-layer stack. Then, the multi-layer stack was hot pressed under the same condition as the above-described one, thereby forming a metal-clad laminate 1.

The respective thicknesses of the first layer 21, the second layer 22, and the metal layer 3 in each metal-clad laminate 1 are as shown in Tables 1-3.

5. Evaluation Tests 5.1 Glass Transition Temperature

An unclad plate consisting of the insulating layer 2 was formed by removing the sheet of metal foil from the metal-clad laminate 1 by etching process. Then, the unclad plate was subjected to dynamic mechanical analysis (DMA). The temperature at which tanδ (loss elastic modulus/storage elastic modulus) thus obtained reached a maximum value was defined to be the glass transition temperature. The dynamic viscoelasticity was measured with a tensile module of a viscoelastic spectrometer (model number DMA7100 manufactured by Hitachi High-Tech Science Corporation) at a temperature increase rate of 5° C./min.

5.2 Coefficient of Linear Expansion

An unclad plate consisting of the insulating layer 2 was formed by removing a sheet of metal foil from the metal-clad laminate 1 by etching process. The coefficient of linear expansion of this unclad plate in a direction perpendicular to the thickness direction at a temperature lower than the glass transition temperature was measured by the TMA method (thermo-mechanical analysis) in compliance with the JIS C6481 standard. At the time of the measurement, a dynamic mechanical analyzer (viscoelasticity spectrometer, model number DMA7100 manufactured by Hitachi High-Tech Science Corporation) was used to make the measurement in a temperature range from 30° C. to 300° C., and a coefficient of linear expansion was obtained based on some of the results thus obtained corresponding to a range lower than the glass transition temperature.

5.3 Peel Strength

The peel strength of the metal layer 3 (sheet of metal foil) with respect to the insulating layer 2 of the metal-clad laminate 1 was measured in compliance with the JIS C6481 standard. At the time of measurement, the sheet of metal foil formed to have a width of 5 mm and a length of 100 mm was peeled off by a tensile tester from the insulating layer 2 at a rate of 50 mm/min, and the peel strength at that time was measured.

5.4 Post-Etching Appearance

An unclad plate consisting of the insulating layer 2 was formed by removing the sheet of metal foil from the metal-clad laminate 1 by etching process. The etching process was performed as chemical etching using an aqueous ferric chloride. The appearance of this unclad plate was observed. If no residues of the sheet of metal foil were recognized, the unclad plate was rated "good." If some residues of the sheet of metal foil were recognized, the unclad plate was rated "bad."

5.5 Dielectric Properties

An unclad plate was formed by removing the sheet of metal foil from the metal-clad laminate 1 by etching process. The relative dielectric constant and dielectric loss tangent of this unclad plate at a test frequency of 1 GHz were measured in accordance with IPC TM-650 2.5.5.5. At the time of measurement, an RF impedance analyzer (model number HP4291B) manufactured by Agilent Technologies, Inc. was used as a measuring device.

The results of these evaluations are summarized in the following Tables 1-3:

TABLE 1

|  |  |  | Examples | | | | | |
|---|---|---|---|---|---|---|---|---|
|  |  |  | 1 | 2 | 3 | 4 | 5 | 6 |
| First layer | Chemical makeup of first resin composition (parts by mass) | Modified PPE | 85 | 85 | 85 | 85 | 85 | 85 |
|  |  | Cross-linking agent 1 | 15 | 15 | 15 | — | 15 | 15 |
|  |  | Cross-linking agent 2 | — | — | — | 15 | — | — |
|  |  | Flame retardant 1 | 12 | 12 | 12 | 12 | 12 | 12 |
|  |  | Flame retardant 2 | 6 | 6 | 6 | 6 | 6 | 6 |
|  |  | Silane coupling agent | 1 | 1 | 1 | 1 | 1 | 1 |
|  |  | Inorganic filler | 61 | 61 | 61 | 61 | 61 | 61 |
|  |  | Fluororesin particles | — | — | — | — | — | — |
|  |  | Composite particles 1 | 61 | 61 | 61 | 61 | 61 | — |

TABLE 1-continued

|  |  |  | Examples | | | | | |
|---|---|---|---|---|---|---|---|---|
|  |  |  | 1 | 2 | 3 | 4 | 5 | 6 |
|  |  | Composite particles 2 | — | — | — | — | — | 61 |
|  |  | Composite particles 3 | — | — | — | — | — | — |
|  | Fibrous base material | IPC number | 1067 | 1067 | 1067 | 1067 | 1067 | 1067 |
|  |  | Number of prepregs | 2 | 2 | 2 | 2 | 2 | 2 |
|  |  | Thickness (μm) | 150 | 150 | 150 | 150 | 150 | 150 |
| Second layer | Chemical makeup of second resin composition (parts by mass) | Modified PPE | 85 | 85 | 85 | 85 | 85 | 85 |
|  |  | Cross-linking agent | 15 | 15 | 15 | 15 | 15 | 15 |
|  |  | Flame retardant 1 | 12 | 12 | 12 | 12 | 12 | 12 |
|  |  | Flame retardant 2 | 6 | 6 | 6 | 6 | 6 | 6 |
|  |  | Silane coupling agent | 1 | 1 | 1 | 1 | 1 | 1 |
|  |  | Inorganic filler | 91 | 91 | 91 | 91 | 91 | 91 |
|  |  | Fluororesin particles | — | — | — | — | — | — |
|  |  | Composite particles | — | — | — | — | 10 | — |
|  |  | Thickness (μm) | 10 | 3 | 25 | 10 | 10 | 10 |
| Metal layer | Material |  | Copper foil | Copper foil | Copper foil | Copper foil | Copper foil | Copper foil |
|  | Thickness (μm) |  | 18 | 18 | 18 | 18 | 18 | 18 |
| Evaluation | Glass transition temperature (° C.) |  | 206 | 206 | 206 | 198 | 208 | 206 |
|  | Coefficient of linear expansion (ppm/° C.) |  | 11.8 | 11.6 | 12.4 | 16.5 | 12.6 | 11.2 |
|  | Peel strength (N/cm) |  | 6 | 5.9 | 6.2 | 6.5 | 5.2 | 6 |
|  | Post-etching appearance |  | good | good | good | good | good | good |
|  | Relative dielectric constant |  | 3.01 | 3.02 | 2.98 | 3.29 | 3.00 | 3.07 |
|  | Dielectric loss tangent |  | 0.0011 | 0.0011 | 0.0011 | 0.0018 | 0.0011 | 0.0011 |

TABLE 2

|  |  |  | Examples | | | | | |
|---|---|---|---|---|---|---|---|---|
|  |  |  | 7 | 8 | 9 | 10 | 11 | 12 |
| First layer | Chemical makeup of first resin composition (parts by mass) | Modified PPE | 85 | 85 | 85 | 85 | 85 | 85 |
|  |  | Cross-linking agent 1 | 15 | 15 | 15 | 15 | 15 | 15 |
|  |  | Cross-linking agent 2 | — | — | — | — | — | — |
|  |  | Flame retardant 1 | 12 | 12 | 12 | 12 | 12 | 12 |
|  |  | Flame retardant 2 | 6 | 6 | 6 | 6 | 6 | 6 |
|  |  | Silane coupling agent | 1 | 1 | 1 | 1 | 1 | 1 |
|  |  | Inorganic filler | 61 | 61 | 61 | 61 | 61 | 61 |
|  |  | Fluororesin particles | — | — | — | — | — | — |
|  |  | Composite particles 1 | — | 61 | 61 | 61 | 61 | 61 |
|  |  | Composite particles 2 | — | — | — | — | — | — |
|  |  | Composite particles 3 | 61 | — | — | — | — | — |
|  | Fibrous base material | IPC number | 1067 | 1037 | 1067 | 1078 | 1078 | 1078 |
|  |  | Number of prepregs | 2 | 1 | 2 | 2 | 2 | 3 |
|  |  | Thickness (μm) | 150 | 40 | 110 | 150 | 170 | 250 |
| Second layer | Chemical makeup of second resin composition (parts by mass) | Modified PPE | 85 | 85 | 85 | 85 | 85 | 85 |
|  |  | Cross-linking agent | 15 | 15 | 15 | 15 | 15 | 15 |
|  |  | Flame retardant 1 | 12 | 12 | 12 | 12 | 12 | 12 |
|  |  | Flame retardant 2 | 6 | 6 | 6 | 6 | 6 | 6 |
|  |  | Silane coupling agent | 1 | 1 | 1 | 1 | 1 | 1 |

TABLE 2-continued

|  |  |  | Examples | | | | | |
|---|---|---|---|---|---|---|---|---|
|  |  |  | 7 | 8 | 9 | 10 | 11 | 12 |
|  |  | Inorganic filler | 91 | 91 | 91 | 91 | 91 | 91 |
|  |  | Fluororesin particles | — | — | — | — | — | — |
|  |  | Composite particles | — | — | — | — | — | — |
|  |  | Thickness (μm) | 10 | 10 | 10 | 10 | 10 | 10 |
| Metal layer | Material |  | Copper foil | Copper foil | Copper foil | Copper foil | Copper foil | Copper foil |
|  | Thickness (μm) |  | 18 | 18 | 18 | 18 | 18 | 18 |
| Evaluation | Glass transition temperature (° C.) |  | 206 | 206 | 206 | 206 | 206 | 206 |
|  | Coefficient of linear expansion (ppm/° C.) |  | 12.4 | 11.7 | 11.7 | 11.7 | 11.8 | 12 |
|  | Peel strength (N/cm) |  | 6 | 5.7 | 5.7 | 5.8 | 6.1 | 6.2 |
|  | Post-etching appearance |  | good | good | good | good | good | good |
|  | Relative dielectric constant |  | 2.98 | 3.07 | 3.07 | 3.11 | 3.07 | 3.07 |
|  | Dielectric loss tangent |  | 0.0011 | 0.0011 | 0.0011 | 0.0011 | 0.0011 | 0.0011 |

TABLE 3

|  |  |  | Comparative examples | | | | |
|---|---|---|---|---|---|---|---|
|  |  |  | 1 | 2 | 3 | 4 | 5 |
| First layer | Chemical makeup of first resin composition (parts by mass) | Modified PPE | 85 | 85 | 85 | 85 | 85 |
|  |  | Cross-linking agent 1 | 15 | — | 15 | 15 | 15 |
|  |  | Cross-linking agent 2 | — | 15 | — | — | — |
|  |  | Flame retardant 1 | 12 | 12 | 12 | 12 | 12 |
|  |  | Flame retardant 2 | 6 | 6 | 6 | 6 | 6 |
|  |  | Silane coupling agent | 1 | 1 | 1 | 1 | 1 |
|  |  | Inorganic filler | 91 | 91 | 61 | 61 | 61 |
|  |  | Fluororesin particles | — | — | 61 | — | 61 |
|  |  | Composite particles 1 | — | — | — | 61 | — |
|  |  | Composite particles 2 | — | — | — | — | — |
|  |  | Composite particles 3 | — | — | — | — | — |
|  | Fibrous base material | IPC number | 1067 | 1067 | 1067 | 1067 | 1078 |
|  |  | Number of prepregs | 3 | 3 | 3 | 3 | 2 |
|  |  | Thickness (μm) | 170 | 170 | 170 | 170 | 150 |
| Second layer | Chemical makeup of second resin composition (parts by mass) | Modified PPE | — | — | — | — | 85 |
|  |  | Cross-linking agent | — | — | — | — | 15 |
|  |  | Flame retardant 1 | — | — | — | — | 12 |
|  |  | Flame retardant 2 | — | — | — | — | 6 |
|  |  | Silane coupling agent | — | — | — | — | 1 |
|  |  | Inorganic filler | — | — | — | — | 91 |
|  |  | Fluororesin particles | — | — | — | — | — |
|  |  | Composite particles | — | — | — | — | — |
|  |  | Thickness (μm) | — | — | — | — | 10 |
| Metal layer | Material |  | Copper foil | Copper foil | Copper foil | Copper foil | Copper foil |
|  | Thickness (μm) |  | 18 | 18 | 18 | 18 | 18 |
| Evaluation | Glass transition temperature (° C.) |  | 204 | 196 | 204 | 204 | 205 |
|  | Coefficient of linear expansion (ppm/° C.) |  | 14.3 | 17.0 | 15.0 | 14.7 | 12.6 |
|  | Peel strength (N/cm) |  | 6.4 | 6.9 | 3.7 | 4.8 | 4.2 |
|  | Post-etching appearance |  | good | good | bad | good | good |
|  | Relative dielectric constant |  | 3.16 | 3.36 | 2.90 | 2.95 | 2.97 |
|  | Dielectric loss tangent |  | 0.0012 | 0.002 | 0.0011 | 0.0011 | 0.0011 |

These results reveal the following. Specifically, in first to twelfth examples, the insulating layer 2 included the first layer 21 and the second layer 22, the first layer 21 contained composite particles, and the second layer 22 contained no composite particles. Thus, it may be recognized that a low coefficient of linear expansion, a high peel strength, a low relative dielectric constant, and a low dielectric loss tangent were achieved.

In second and third examples, as the thickness of the second layer changed compared to the first example, the resin content in the insulating layer also changed. Thus, variations in coefficient of linear expansion and relative dielectric constant were observed accordingly.

In a fourth example, the cross-linking agent was changed from that of the first example, and therefore, variations in glass transition temperature, relative dielectric constant, and peel strength were observed.

In a fifth example, composite particles were added to the second layer, and therefore, a decrease in peel strength was observed compared to the first example.

In sixth and seventh examples, as the particle size of the composite particles increased, the relative dielectric constant decreased but an increase in coefficient of linear expansion was observed.

In eighth to twelfth examples, as the fibrous base material was changed and as the thicknesses of the first and second layers were changed, the resin content of the insulating layer also changed, and a variation in relative dielectric constant was also observed accordingly. Specifically, in the first example, the resin content was 73% by mass. In the eighth, ninth, eleventh, and twelfth examples, the resin content was approximately 65% and the relative dielectric constant was higher than in the first example. In a tenth example, the resin content further decreased and the relative dielectric constant further increased accordingly.

On the other hand, in first and second comparative examples, the insulating layer 2 included no composite particles or fluororesin particles, and therefore, the relative dielectric constant increased even though the peel strength was high. In a third comparative example, the insulating layer 2 included fluororesin particles but had no second layer 22, and therefore, the peel strength decreased even though the relative dielectric constant was low. In a fourth comparative example, the insulating layer 2 included composite particles but had no second layer 22, and therefore, the peel strength decreased even though the relative dielectric constant was low. In a fifth comparative example, the insulating layer 2 had the second layer 22 but the first layer 21 included fluororesin particles with no composite particles, and therefore, the peel strength decreased even though the relative dielectric constant was low.

In addition, in the third comparative example, the post-etching appearance was rated "bad." This is presumably because the insulating layer 2 in the third comparative example consisted of only a layer including fluororesin particles with no composite particles, and therefore, the insulating layer 2 would have repelled the aqueous ferric chloride easily at the time of the etching process, thus causing a decline in the efficiency of the etching process.

The invention claimed is:

1. A metal-clad laminate comprising: an insulating layer; and a metal layer stacked on the insulating layer,
   the insulating layer including: a first layer; and a second layer interposed between the first layer and the metal layer,
   the first layer containing a cured product of a first resin composition,
   the second layer containing a cured product of a second resin composition,
   the first resin composition containing composite particles, each of the composite particles having a core containing a fluororesin and a shell containing a silicon oxide that coats the core at least partially,
   the second resin composition either containing composite particles, each of the composite particles having a core containing the fluororesin and a shell containing the silicon oxide that coats the core at least partially, or containing no such composite particles, wherein
   when the second resin composition contains the composite particles, a ratio of the composite particles in the second resin composition to solid content of the second resin composition is lower than a ratio of the composite particles in the first resin composition to solid content of the first resin composition.

2. The metal-clad laminate of claim 1, wherein
each of the first resin composition and the second resin composition contains: a modified polyphenylene ether compound (A) having, at one terminal, a group with an unsaturated double bond; and a cross-linking agent (B) having a carbon-carbon double bond.

3. The metal-clad laminate of claim 2, wherein
the fluororesin contains polytetrafluoroethylene.

4. The metal-clad laminate of claim 3, wherein
the shell has at least one functional group selected from the group consisting of a hydroxyl group, a phenylamino group, and a vinyl group.

5. The metal-clad laminate of claim 2, wherein
the composite particles in the first layer have a median size falling within a range from 0.2 μm to 15 μm.

6. The metal-clad laminate of claim 2, wherein
the first layer further contains a glass fiber base material.

7. The metal-clad laminate of claim 2, wherein
the second layer contains no glass fiber base material.

8. The metal-clad laminate of claim 1, wherein
the second layer has a thickness falling within a range from 1 μm to 25 μm, and
the insulating layer has a thickness falling within a range from 5 μm to 250 μm.

9. The metal-clad laminate of claim 1, wherein
the fluororesin contains polytetrafluoroethylene.

10. The metal-clad laminate of claim 9, wherein
the shell has at least one functional group selected from the group consisting of a hydroxyl group, a phenylamino group, and a vinyl group.

11. The metal-clad laminate of claim 9, wherein
the composite particles in the first layer have a median size falling within a range from 0.2 μm to 15 μm.

12. The metal-clad laminate of claim 9, wherein
the first layer further contains a glass fiber base material.

13. The metal-clad laminate of claim 9, wherein
the second layer contains no glass fiber base material.

14. The metal-clad laminate of claim 1, wherein
the composite particles in the first layer have a median size falling within a range from 0.2 μm to 15 μm.

15. The metal-clad laminate of claim 1, wherein
the first layer further contains a glass fiber base material.

16. The metal-clad laminate of claim 1, wherein
the second layer contains no glass fiber base material.

17. The metal-clad laminate of claim 1, wherein
a peel strength of the metal layer with respect to the insulating layer is equal to or greater than 5 N/cm, and
the insulating layer has a relative dielectric constant equal to or less than 3.15.

18. The metal-clad laminate of claim 1, wherein the insulating layer has a coefficient of linear expansion equal to or less than 14.0 ppm/° C.

19. A printed wiring board comprising: an insulating layer; and conductor wiring stacked on the insulating layer,
the insulating layer including: a first layer; and a second layer interposed between the first layer and the conductor wiring,
the first layer containing a cured product of a first resin composition,
the second layer containing a cured product of a second resin composition,
the first resin composition containing composite particles, each of the composite particles having a core containing a fluororesin and a shell containing a silicon oxide that coats the core at least partially,
the second resin composition either containing composite particles, each of the composite particles having a core containing the fluororesin and a shell containing the silicon oxide that coats the core at least partially, or containing no such composite particles, wherein
when the second resin composition contains the composite particles, a ratio of the composite particles in the second resin composition to solid content of the second resin composition is lower than a ratio of the composite particles in the first resin composition to solid content of the first resin composition.

* * * * *